United States Patent
Ehmann

(10) Patent No.: US 12,319,519 B2
(45) Date of Patent: Jun. 3, 2025

(54) CARRIER TRANSPORT SYSTEM, VACUUM PROCESSING APPARATUS, AND METHOD OF TRANSPORTATION OF A CARRIER IN A VACUUM CHAMBER

(71) Applicant: Applied Materials, Inc., Santa Clara, CA (US)

(72) Inventor: Christian Wolfgang Ehmann, Darmstadt (DE)

(73) Assignee: Applied Materials, Inc., Santa Clara, CA (US)

( * ) Notice: Subject to any disclaimer, the term of this patent is extended or adjusted under 35 U.S.C. 154(b) by 163 days.

(21) Appl. No.: 17/788,952

(22) PCT Filed: May 13, 2020

(86) PCT No.: PCT/EP2020/063379
§ 371 (c)(1),
(2) Date: Jun. 24, 2022

(87) PCT Pub. No.: WO2021/228390
PCT Pub. Date: Nov. 18, 2021

(65) Prior Publication Data
US 2023/0055201 A1    Feb. 23, 2023

(51) Int. Cl.
*B65G 54/02* (2006.01)
*B65G 13/11* (2006.01)

(52) U.S. Cl.
CPC .............. *B65G 54/02* (2013.01); *B65G 13/11* (2013.01)

(58) Field of Classification Search
None
See application file for complete search history.

(56) References Cited

U.S. PATENT DOCUMENTS 6,471,459 B2 * 10/2002 Blonigan .......... H01L 21/67742
   414/217
7,770,714 B2 *  8/2010 Nozawa ............ H01L 21/67712
   414/217
(Continued)

FOREIGN PATENT DOCUMENTS

CN        110651361 A    1/2020
JP        2001284438 A  10/2001
(Continued)

OTHER PUBLICATIONS

Japanese Office Action dated Jan. 16, 2024 for Application No. 2022-544701.
(Continued)

*Primary Examiner* — Jonathan Snelting
(74) *Attorney, Agent, or Firm* — Patterson + Sheridan, LLP

(57) ABSTRACT

A carrier transport system for transporting a carrier within a vacuum chamber is described. The carrier transport system includes a track assembly extending in a transport direction, the track assembly comprising: a first passive magnetic unit provided at a first vertical coordinate and extending in the transport direction, a second passive magnetic unit provided at a second vertical coordinate and extending in the transport direction, wherein the first passive magnetic unit and the second passive magnetic unit are configured to counteract the weight of the carrier; and a roller transportation track provided at a third vertical coordinate and comprising a plurality of rollers configured to support partial weight of the carrier, wherein a first vertical distance between the first vertical coordinate and the second vertical coordinate is larger than a second distance between the second vertical coordinate and the third vertical coordinate.

19 Claims, 4 Drawing Sheets

(56) References Cited

U.S. PATENT DOCUMENTS

| | | | |
|---|---|---|---|
| 8,297,196 B2 | 10/2012 | Yeo et al. | |
| 9,156,632 B2 * | 10/2015 | Maeda | H02K 41/02 |
| 9,300,181 B2 * | 3/2016 | Maeda | H02K 41/031 |
| 2009/0056878 A1 | 3/2009 | Nozawa et al. | |

FOREIGN PATENT DOCUMENTS

| | | | |
|---|---|---|---|
| JP | 2009051608 A | 3/2009 | |
| JP | 2017506703 A | 3/2017 | |
| JP | 2019532486 A | 11/2019 | |
| KR | 20080046761 A | 5/2008 | |
| KR | 100880877 B1 | 1/2009 | |
| KR | 100945456 B1 | 3/2010 | |
| KR | 20110094941 A | 8/2011 | |
| KR | 2012-0088980 A | 8/2012 | |
| KR | 20190132096 A | 11/2019 | |
| WO | 2020001751 A1 | 1/2020 | |
| WO | 2020/043277 A1 | 3/2020 | |
| WO | 2020045942 A1 | 3/2020 | |

OTHER PUBLICATIONS

International Search Report and Written Opinion, PCT/EP2020/063379, Dec. 11, 2020.
Chinese Office Action dated Jan. 19, 2024 for Application No. 202080094106.6.
Korean Office Action dated Aug. 23, 2024 for Application No. 10-2022-7026009.

* cited by examiner

CARRIER TRANSPORT SYSTEM, VACUUM PROCESSING APPARATUS, AND METHOD OF TRANSPORTATION OF A CARRIER IN A VACUUM CHAMBER

TECHNICAL FIELD

Embodiments of the present disclosure relate to apparatuses and methods for transportation of carriers, particularly carriers used for carrying large area substrates. More specifically, embodiments of the present disclosure relate to apparatuses and methods for transportation of carriers employable in processing apparatuses for vertical substrate processing, e.g. material deposition on large area substrates for display production. In particular, embodiments of the present disclosure relate to carrier transport systems, vacuum processing apparatuses, and methods of transporting a carrier in a vacuum chamber.

BACKGROUND

In order to process a substrate, an in-line arrangement of processing modules can be used. An in-line processing system includes a plurality of subsequent processing modules, such as deposition modules and optionally further processing modules, e.g., cleaning modules and/or etching modules, wherein processing aspects are subsequently conducted in the processing modules, such that a plurality of substrates can continuously or quasi-continuously be processed in the in-line processing system.

The substrate is typically carried by a carrier, i.e. a carrying device for carrying the substrate. The carrier is typically transported through a vacuum system using a carrier transport system. The carrier transport system may be configured for conveying the carrier carrying the substrate along one or more transport paths.

One way to guide and move the carriers in transport direction are rollers below the carrier and a rod in contact with rollers. The rollers are driven by motors, and by the typical shape of the roller they also guide the carrier in a lateral direction. The friction between driving roller and carrier leads to particle generation. Moreover, since the lateral guiding force is created by a typical shape of rollers, in the case of misaligned rollers, the carrier rod would move out of center and slightly upward which also leads to particle generation.

For obtaining high quality devices, technical challenges with respect to the processing of substrates need to be mastered. In particular, an accurate and smooth transportation of the carriers through the vacuum system is challenging. For instance, particle generation due to wear of moving parts can cause a deterioration in the manufacturing process. Accordingly, there is a demand for the transportation of carriers in vacuum deposition systems with reduced or minimized particle generation. Further challenges are, for example, to provide robust carrier transport systems for high temperature vacuum environments at low costs.

Typically, the carriers may be guided by rollers and the stronger the load on the rollers, the larger the risk of particle generation, and the shorter the lifetime of the rollers. Fully contactless floating carrier transportation systems are complicated and expensive. Magnetic levitation systems with permanent magnets are difficult to realize. At least one degree of freedom has to be stabilized mechanically or with guide elements to overcome Earnshaw's theorem.

Accordingly, a simple and compact arrangement to guide a carrier, particularly a vertically oriented carrier, to compensate gravity to minimize forces on mechanical elements as much as possible would be beneficial. Minimizing forces on mechanical elements can reduce generation of particles during carrier transportation and lifetime of the mechanical elements can be increased.

Accordingly, it would be beneficial to provide improved apparatuses and methods for transporting carriers in a vacuum chamber.

SUMMARY

In light of the above, carrier transport systems for transporting a carrier in a vacuum chamber, an apparatus for vacuum processing, as well as methods of transporting a carrier in a vacuum chamber according to the independent claims are provided. Further aspects, advantages, and features are apparent from the dependent claims, the description, and the accompanying drawings.

According to one embodiment, a carrier transport system for transporting a carrier within a vacuum chamber is provided. The carrier transport system includes a track assembly extending in a transport direction, the track assembly comprising: a first passive magnetic unit provided at a first vertical coordinate and extending in the transport direction, a second passive magnetic unit provided at a second vertical coordinate and extending in the transport direction, wherein the first passive magnetic unit and the second passive magnetic unit are configured to counteract the weight of the carrier; and a roller transportation track provided at a third vertical coordinate and comprising a plurality of rollers configured to support partial weight of the carrier, wherein a first vertical distance between the first vertical coordinate and the second vertical coordinate is larger than a second distance between the second vertical coordinate and the third vertical coordinate.

According to one embodiment, a carrier for a substrate to be processed in an apparatus for vacuum processing of the substrate is provided. The carrier includes a first passive magnetic unit provided at a first vertical carrier coordinate and; a second passive magnetic unit provided at a second vertical carrier coordinate; and a third passive magnetic unit provided at a third vertical carrier coordinate, wherein a first vertical carrier distance between the first vertical carrier coordinate and the second vertical carrier coordinate is larger than a second carrier distance between the second vertical carrier coordinate and the third vertical carrier coordinate.

According to one embodiment, an apparatus for vacuum processing of a substrate is provided. The apparatus includes a vacuum chamber; and a carrier transport system according to any of the embodiments described herein. As a further optional modification, also a carrier according to any of the embodiments of the present disclosure may be included in the apparatus for vacuum processing.

According to one embodiment, a method for transportation of a carrier within the vacuum chamber is provided. The method includes transporting the carrier on a track assembly with partial counteraction of the weight of the carrier by first passive magnetic units; transporting the carrier on the track assembly with partial counteraction of the weight of the carrier by second passive magnet units; and transporting the carrier on the track assembly with partial weight of the carrier on the at least one of the plurality of the rollers.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION OF EMBODIMENTS

Reference will now be made in detail to the various embodiments of the disclosure, one or more examples of which are illustrated in the figures. Within the following description of the drawings, the same reference numbers refer to same components. Only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

A carrier transport system is configured for transporting a carrier in a vacuum environment, particularly in a vacuum chamber or in a vacuum system including a plurality of vacuum chambers arranged next to each other, e.g. in a linear array. The carrier transport system may provide one, two or more transport paths wherein the carrier can be moved or conveyed along the one or more transport paths in a transport direction.

The carrier transport system described herein can be a part of a vacuum processing system, particularly a vacuum deposition system configured for depositing a material on a substrate carried by a carrier. The carrier transport system may be configured to displace or transfer the carrier.

The carrier transport system may be configured to transfer the carrier with counteracting the weight of the carrier, particularly more than 100% of the weight of the carrier, with magnetic levitation. The magnetic levitation can include arrays of passive magnetic poles arranged in two elongated rows in the transportation direction.

The magnetic levitation is furthermore configured to stabilize the carrier in the lateral direction. The lateral direction can be understood as the direction perpendicular to the vertical direction and perpendicular to the transportation direction.

Figure 1:
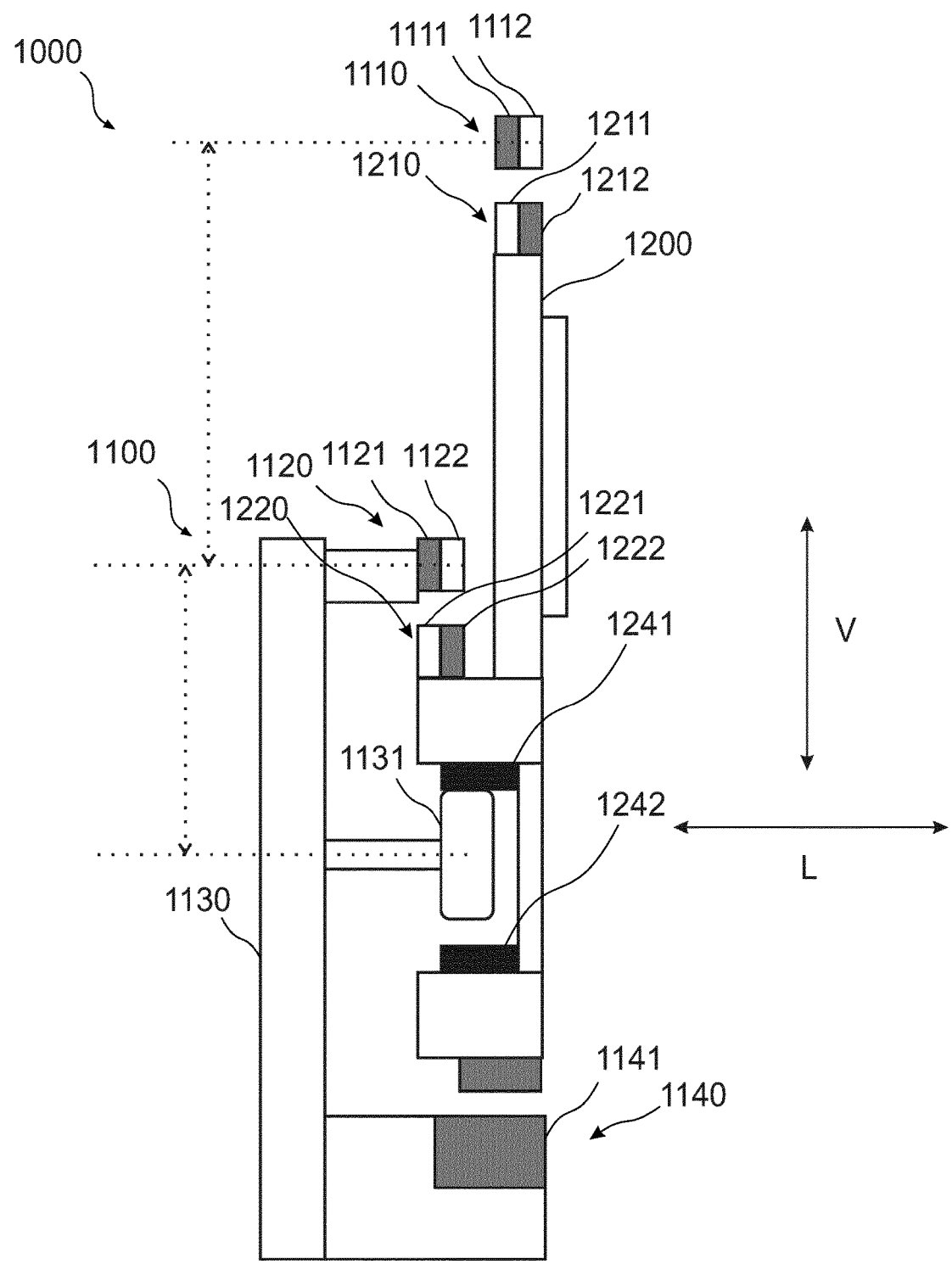
FIG. 1 shows a schematic cross section view of a carrier transport system and a carrier according to embodiments described herein.
Figure 2:
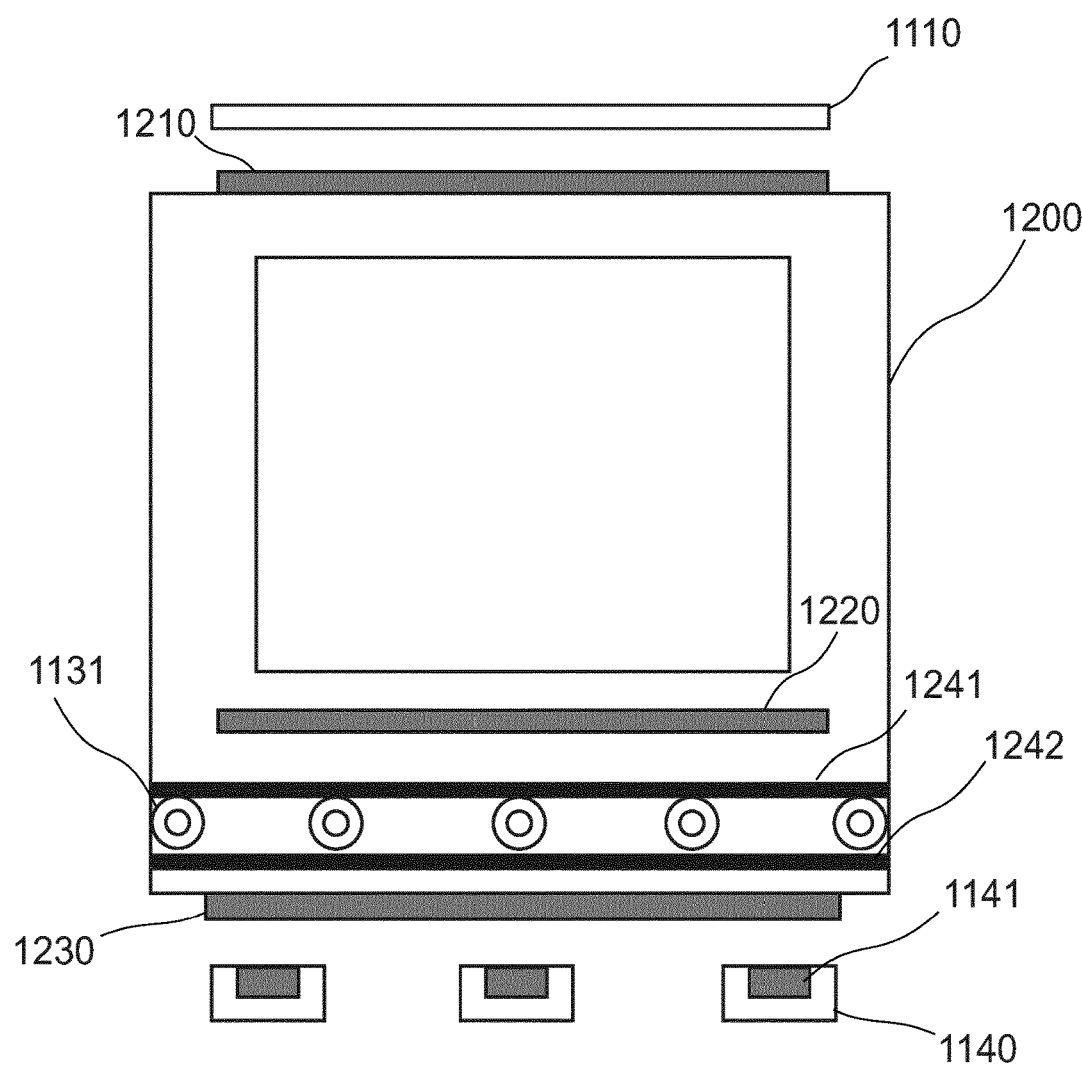
FIG. 2 shows a schematic side view of a carrier according to embodiments described herein.

FIG. 1 is a schematic cross section view of carrier transport system 1000 including a track assembly 1100 according to embodiments herein. FIG. 2 shows a schematic front view of carrier transport system and a carrier according to embodiments described herein. Reference can be made to both FIG. 1 and FIG. 2. The carrier transport system 1000 is configured for transportation of a carrier 1200. The carrier may carry a substrate or mask in a transportation direction T in a vacuum chamber. However, the present disclosure is not limited thereto, and carrier 1200 may be configured for transporting other products or tools typically used in a vacuum processing system. The transportation direction T is perpendicular to the paper plane of FIG. 1. The carrier 1200 has an essentially vertical orientation V during the transport (e.g., a vertical orientation)+/−10°.

Some embodiments described herein involve the notion of carrier 1200 being transported in a "vertical or near-vertical orientation" or an essentially vertical orientation. A vertical orientation of carrier 1200 in the context of the present disclosure refers to carrier 1200 being aligned to extend in a direction substantially parallel to the direction along which the force of gravity, i.e. substantially parallel to vertical direction Y. A near-vertical orientation may be defined as an orientation which deviates from exact verticality (the latter being defined by the gravitational force) by an angle of up to 15 degrees. In a vertical or near-vertical orientation, carrier 1200 may support a substrate in a vertically standing or near-vertically standing orientation. Similarly, an essentially horizontal orientation may have a deviation of up to 15 degrees from horizontal.

According to embodiments described herein, the track assembly 1100 includes the first passive magnetic unit 1110 extending in the transportation direction T. As shown in FIG. 1, the first passive magnetic unit is configured to be on top of the carrier. The first passive magnetic unit 1110 has a first magnetic pole 1111 and a second magnetic pole 1112. The first magnetic pole 1111 is laterally offset with the second magnetic pole 1112. For example, the first magnetic pole 1111 can be horizontally next to the second magnetic pole 1112. Alternatively, the first magnet pole can be vertically next to the second magnetic pole. The first magnetic pole and the second magnetic pole can be the opposite poles of a passive magnet.

Figure 3:
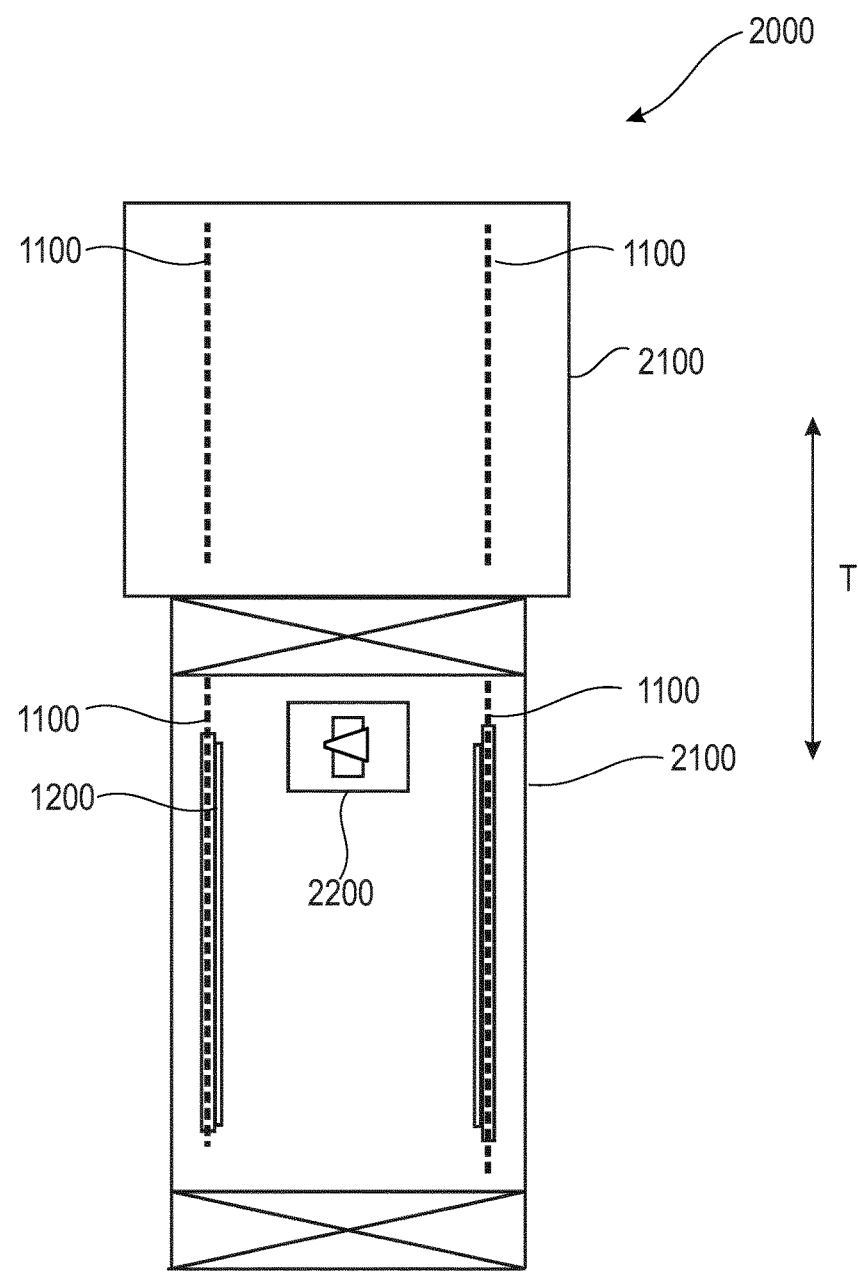
FIG. 3 shows a schematic view of an apparatus for vacuum processing of a substrate according to embodiments described herein.

According to embodiments described herein, an apparatus for vacuum processing of a substrate 2000 can include at least a vacuum chamber 2100 (shown in FIG. 3), a deposition apparatus 2200 for vacuum processing of a substrate, and a carrier transportation system 1000 within the vacuum chamber 2100.

According to embodiments described herein, the apparatus for vacuum processing of a substrate 2000 (see FIG. 3) can include a carrier 1200 configured to support a substrate or substrate mask. The carrier 1200 can include the first passive magnetic unit 1210 on top of the carrier as shown in FIG. 1. The first passive magnetic unit 1210 can have a first magnetic pole 1211 and a second magnetic pole 1212 laterally offset from the first magnetic pole 1211. For example, the first magnetic pole 1211 can be horizontally next to the second magnetic pole 1212. Alternatively, the first magnet pole can be vertically next to the second magnetic pole. The first magnetic pole and the second magnetic pole can be the opposite poles of a passive magnet. The magnet poles of the carrier and of the track assembly may both be vertically arranged or may both be horizontally arranged. Accordingly, lateral stabilization can be provided.

The first passive magnetic unit 1210 of the carrier is configured to magnetically couple with the first passive magnetic unit 1110 of the track assembly. The first magnetic pole and the second magnetic pole of the carrier are the opposite poles of the first magnetic pole and the second magnetic pole of the track assembly. Accordingly, the magnetic force between the first passive magnetic unit 1210 of the carrier and the first passive magnetic unit 1110 of the track assembly is an attractive force in the counter direction of the gravitation force. For example, the north pole of the first passive magnetic unit of the track assembly may face the south pole of the first passive magnetic unit of the carrier and vice versa.

According to embodiments described herein, the track assembly 1100 includes the second passive magnetic unit 1120 extending in the transportation direction T. The second passive magnetic unit 1120 has a third magnetic pole 1121 and a fourth magnetic pole 1122. The third magnetic pole 1121 is laterally offset from the fourth magnetic pole 1122. For example, the third magnetic pole 1121 can be horizontally next to the fourth magnetic pole 1122. The third magnetic pole and the fourth magnetic pole can be the opposite poles of a passive magnet.

The carrier 1200 further includes a second passive magnetic unit 1220 having a third magnetic pole 1221 and a fourth magnetic pole 1222 laterally offset from the first magnetic pole 1221. For example, the third magnetic pole 1221 can be horizontally next to the fourth magnetic pole 1222. The third magnetic pole and the fourth magnetic pole can be the opposite poles of a passive magnet.

The second passive magnetic unit 1220 of the carrier is configured to magnetically couple with the second passive magnetic unit 1120 of the track assembly. The third magnetic pole and the fourth magnetic pole of the carrier are the opposite poles of the third magnetic pole and the fourth magnetic pole of the track assembly. Accordingly, the magnetic force between the second passive magnetic unit 1220 of the carrier and the second passive magnetic unit 1120 of the track assembly is an attractive force in the counter direction of the gravitation force. For example, the north pole of the second passive magnetic unit of the track assembly may face the south pole of the second passive magnetic unit of the carrier and vice versa. Similarly, for a vertical arrangement of the magnet poles, the north pole of the first and/or second passive magnetic unit of the track assembly may face the south pole of the corresponding first and/or second passive magnetic unit of the carrier. Alternatively, the south pole of the first and/or second passive magnetic unit of the track assembly may face the north pole of the corresponding first and/or second passive magnetic unit of the carrier.

The first passive magnetic unit 1110 of the track assembly may be configured to be on top of the carrier 1200 being magnetically coupled with the first passive magnetic unit 1210 of the carrier 1200. The first passive magnetic unit 1110 of the track assembly is configured to counteract at least 20% of the weight of the carrier 1200 and partially levitate the substrate carrier. The first passive magnetic unit 1110 of the track assembly is further configured to couple with the first passive magnetic unit 1210 of the carrier in order to laterally stabilize the carrier 1200 by means of compensating lateral disorientation and cancelling lateral vibrations. The lateral guiding magnets behave like a mechanical spring, but without any mechanical contact and thus generates no particles.

As shown in FIG. 1, the second passive magnetic unit 1120 of the track assembly may be configured to be on the side of the carrier 1200 being coupled with the second passive magnetic unit 1220 of the carrier 1200. The second passive magnetic unit 1120 of the track assembly is configured to counteract the at least 60% of the weight of the carrier 1200 and partially levitate the substrate carrier. The second passive magnetic unit 1120 of the track assembly further configured to couple with the second passive magnetic unit 1220 of the carrier in order to laterally stabilize the carrier 1200 by means of compensating lateral disorientation and cancelling lateral vibrations. The lateral guiding magnets behave like a mechanical spring, but without any mechanical contact and thus generates no particles.

According to embodiments described herein, the first passive magnetic unit 1110 of the track assembly and the second passive magnetic unit 1120 of the track assembly are configured to counteract at least the weight of a carrier 1200 or more. The magnetic levitation provided from coupling the first passive magnetic unit 1110 of the track assembly and the first passive magnetic unit 1210 of the carrier together with the magnetic levitation provided from coupling the second passive magnetic unit 1120 of the track assembly and the second passive magnetic unit 1220 of the carrier, counteracts at least 70%, particularly at least 90% of the carrier weight, more particularly 100% or more.

According to embodiments of the present disclosure, the weight of the carrier, particularly an essentially vertically oriented carrier is supported by the first passive magnetic unit at the top of the carrier, the second magnetic unit oriented towards the bottom of the carrier, i.e. vertically below the first passive magnetic unit and the rollers. A downward pulling force of the drive assembly is further counteracted by the first passive magnetic unit at the top of the carrier, the second magnetic unit oriented towards the bottom of the carrier, i.e. vertically below the first passive magnetic unit and the rollers.

During processing of a substrate, the carrier may be heated. Accordingly, there is a thermal expansion. Particularly for vertically oriented or essentially vertically oriented substrates, wherein the substrates may have a vertical extension of 1 m or above or even up to several meters, i.e. large area substrates, the thermal expansion can be significant. Accordingly, it is beneficial if the second passive magnetic unit, i.e. the passive magnetic unit below the first passive magnetic unit at the top of the carrier, counteracts a majority of the weight of the carrier. The amount of thermal expansion at the position of the second passive magnetic unit is less as compared to the amount of thermal expansion adjacent to the first passive magnetic unit. Accordingly, the supporting forces of the passive magnetic units are less impacted by thermal expansion at the position of the second passive magnetic unit.

FIG. 1 shows the second passive magnetic unit at a vertical position between the rollers and the first passive magnetic unit. According to some embodiments, which can be combined with other embodiments described herein, the second passive magnetic unit may also be provided vertically below the rollers. The second passive magnetic unit and the rollers can be vertically close to each other in order to reduce the effect of thermal expansion. For example, the second passive magnetic unit and the rollers may have a vertical distance that is 20% or less of the vertical carrier dimension, particularly 10% or less of the vertical carrier dimension, more particularly 5% or less of the vertical carrier dimension.

As described above, according to embodiments of the present disclosure, the second passive magnetic unit may counteract at least 70% of the weight of the carrier, i.e. the second passive magnetic unit is dominating the support of the carrier. The rollers and the second passive magnetic unit are comparable close together. Accordingly, impact of the thermal expansion on the forces supporting the carrier is reduced.

FIG. 2 shows a schematic view of an apparatus for vacuum processing of a substrate according to embodiments described herein. The carrier can be transported in transportation direction, particularly shown in FIG. 2 to the left or to the right direction. The magnetic levitation can counteract at least partial weight of the carrier upward, particularly 100% or more of the weight of the carrier.

According to embodiments described herein, the carrier 1200 can include a third passive magnetic unit 1230. The third passive magnetic unit is coupled to the bottom of the carrier 1200 as depicted in FIG. 1 and FIG. 2.

As shown in FIG. 1, the second passive magnetic unit 1220 of the carrier, is vertically located inbetween the first passive magnetic unit 1210 of the carrier and the third passive magnetic unit 1230 of the carrier 1200. According to some embodiments, which may be combined with other embodiments described herein, the second passive magnetic unit may be laterally offset from the first passive magnetic unit 1210 of the carrier and the third passive magnetic unit 1230 of the carrier 1200. The lateral offset is beneficially small, i.e. close to the center of gravity of the carrier.

According to embodiments described herein, the track assembly further includes a drive assembly 1140. The drive assembly 1140 has a set of linear motors 1141 extending in the transportation direction T. The linear motor 1141 can include a plurality of coil units configured to generate a magnetic field. The drive assembly 1140 generates a force parallel to the force of gravity. The force parallel to the force of gravity that this generated by the drive assembly is further compensated by the passive magnetic units and the rollers. The drive assembly 1140 further provides a pulling and pushing force in the transportation direction T in order to transport the carrier 1200. There are also other solutions to create this force.

According to embodiments described herein, the drive assembly 1140 may comprise a linear motor 1141 configured to apply a magnetic force on the carrier for moving the carrier along the track assembly in the transport direction T. The at least one drive assembly 1140 may include a plurality of linear motors provided at the track assembly, e.g. at predetermined intervals along the transport direction T.

The linear motor 1141 of the drive assembly may be configured to couple with the third passive magnetic unit 1230 of the carrier 1200 in order to provide pushing force in the transportation direction T. The drive assembly's linear motor 1141 coupling with the third passive magnetic unit 1230 of the carrier provides force in order to transport the carrier in the transportation direction T. The magnetic drive to create the driving force in the transportation direction T, is contactless and accordingly does not generate particles in the transportation process.

The drive assembly 1140 can be controlled by a controller via a motor drive. In some implementations, the at least one drive assembly 1140 may include a synchronous linear motor 1141. In other embodiments, the at least one drive assembly 1140 may include an asynchronous linear motor 1141.

The second passive magnetic unit 1120 of the track assembly, is vertically between the first passive magnetic unit 1110 of the track assembly and the set of linear motor (magnets) 1141 of the drive assembly 1140. The second passive magnetic unit 1120 of the track assembly, may be laterally offset from the first passive magnetic unit 1110 of the track assembly and the set of linear motors (magnets) 1141 of the drive assembly 1140.

According to some embodiments, which can be combined with other embodiments described herein, the first passive magnetic unit 1110 is provided at a first vertical coordinate and the second passive magnetic unit 1120 is provided at a second vertical coordinate. The roller transportation track 1130 is provided at a third vertical coordinate. A first vertical distance between the first vertical coordinate and the second vertical coordinate is larger than a second distance between the second vertical coordinate and the third vertical coordinate. The vertical coordinates and vertical distances are shown by dotted lines in FIG. 1.

According to some exemplarily implementations, the track assembly 1100 extends in the transport direction and includes the first passive magnetic unit extending in the transport direction, the first passive magnetic unit having a first magnetic pole and a second magnetic pole, for example, laterally or vertically offset from the first magnetic pole. The track assembly includes the second passive magnetic unit extending in the transport direction and having a third magnetic pole and a fourth magnetic pole, for example, laterally or vertically offset from the third magnetic pole. The first passive magnetic unit and the second passive magnetic unit are configured to counteract at least the weight of the carrier. Further, the roller transportation track having a plurality of rollers configured to support partial weight of the carrier is provided. The drive assembly 1140 includes a set of active magnets extending in the transportation direction generating a force parallel to the force of gravity.

A corresponding carrier includes a first passive magnetic unit 1210 of the carrier provided at a first vertical carrier coordinate and a second passive magnetic unit 1220 of the carrier provided at a second vertical carrier coordinate. A third passive magnetic unit 1230 of the carrier is provided at a third vertical coordinate, wherein a first vertical carrier distance between the first vertical carrier coordinate and the second vertical carrier coordinate is larger than a second carrier distance between the second vertical carrier coordinate and the third vertical carrier coordinate.

According to embodiments described herein, the track assembly has a roller transportation track 1130. The roller transportation track 1130 has plurality of rollers 1131. The rollers 1131 are configured to support at least partial weight of the carrier 1200 and rotate about an axis parallel to the lateral direction with low friction. The at least one of the plurality of rollers 1131 are in contact with the carrier 1200. According to some embodiments, the contact surface of the rollers 1131 has a cylindrical shape. The rollers may have a cylindrical portion and may further have a spherical portion, i.e. a further radius at one or both sides of the cylindrical portion. The roller extend at least partially parallel to a rotation axis of the respective roller.

According to embodiments of the present disclosure, the rollers support a partial weight of the carrier, for example 30% or less. Having a contactless drive assembly, e.g. magnetic drive assembly, allows to reduce the force on the rollers because friction at the rollers is not utilized to drive the carrier in transport direction.

According to embodiments described herein, the carrier 1200 has a first rail 1241 configured to be in contact with the top surface of the at least one of the plurality of rollers 1131. The carrier 1200 further includes the second rail 1242. The second rail 1242 may be configured to be in contact with the bottom of the at least one of the pluralities of the rollers 1131. According to some embodiments, which can be combined with other embodiments described, herein a gap can be provided between the second rail and the bottom of the rollers. For example, the gap can be 1 mm or less, such as 0.5 mm or less or even less than 0.3 mm. The distance between the first rail and the second rail is slightly larger than the diameter of the rollers, e.g. by 1 mm or less, such as 0.5 mm or less or even less than 0.3 mm.

According to embodiments described herein, the resultant force of the magnetic levitation forces (1110-1210 and 1120-1220), the pulling downward force generated by drive assembly 1140 and the third passive magnetic unit 1230 can be 30% of the carrier weight or less, for example 20% or less, such as 10% or less. The resultant force is supported by the at least one of the pluralities of rollers 1131. The top of the at least one of the plurality of rollers 1131 is configured to be in contact with the first rail 1241 to be able to compensate the resultant force as schematically depicted in FIG. 1 and FIG. 2. The at least one of the plurality of rollers 1131 carry the resultant force and overcome instability of magnet pairs in the vertical direction. The minimized contact surface between carrier and track assembly as well as minimizing the weight on the rollers 1131 significantly lowers the particle generation due to transportation.

According to some embodiments, which can be combined with other embodiments described here, the first passive magnetic unit may carry 20% to 60%, for example, about 40% of the weight of the carrier. Additionally or alternatively, the second passive magnetic unit may carry 70% to 95%, for example, about 90% of the weight of the carrier. Additionally or alternatively, the downward force generated by the drive assembly may be 20% to 60%, for example, about 40% of the weight of the carrier.

According to embodiments described herein, the track assembly and the arrangement of the passive magnets of the carrier can be compact and simple. The remaining resultant force on the rollers is minimized as much as possible and therefore, the generation of particles during carrier transportation can be significantly reduced. Accordingly, the lifetime of the rollers can be significantly increased.

In some embodiments, which may be combined with other embodiments described herein, the bottom of the at least one roller 1131 may be configured to be in contact with the second rail 1242 to vertically stabilize the movement of the carrier. When the carrier is transported in the transportation direction, partial weight of the carrier is carried by the at least one roller 1131. In such a situation there is a contact between the first rail 1241 and top surface of the at least one roller 1131, and there is no contact between the second rail 1242 and bottom surface of the roller 1131. In this way, during operation the contact points between the track assembly and the carrier are minimized, therefore, the particle generation during the transportation can be significantly reduced.

When the carrier 1200 is transported along the transportation direction T, there might be some misalignment and the carrier and transportation assembly are not fully parallel. In such a situation the second rail and the bottom surface of the roller can be in contact with each other and help with alignment. In a similar situation of vertical movements of the carrier, the roller 1131 and the first rail 1241 and second rail 1242 can help the vertical stabilization.

In some embodiments, which may be combined with other embodiments described herein, the first rail 1241 and the second rail 1242 of the carrier can be made of elastic materials. The elastic rails have an advantageous effect of providing a suspension effect to the transport of carrier 1200. Elastic rails may provide a smoother, more efficient transport of carrier 1200 by absorbing impacts and vibrations. Elastic rails may be further enhanced with the addition of a damping means for more optimal control of impacts and vibrations.

According to embodiments described herein, the plurality of rollers 1131 and the first rail 1241 and the second rail 1242, can be understood as a mechanical guide to overcome remaining instability of the plurality of magnets. By Earnshaw's theorem, it is not possible to create completely contact free guiding only with permanent magnets.

Figure 4:
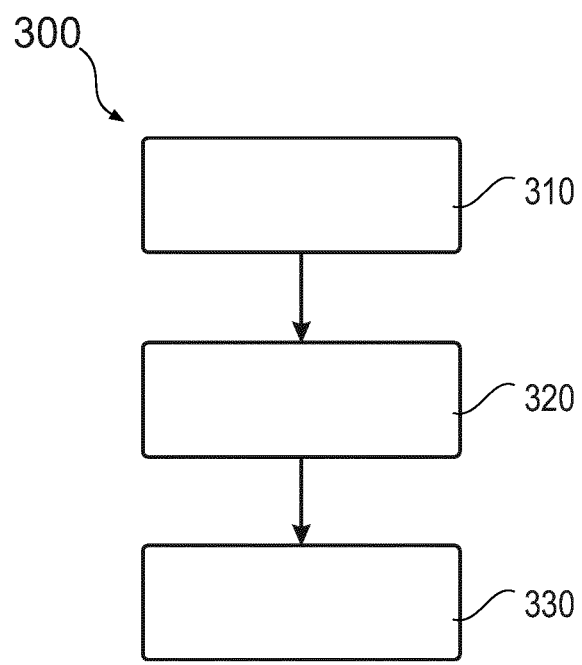
FIG. 4 shows a flowchart of a method for transportation of a carrier within the vacuum chamber according to embodiments described herein.

FIG. 4 is a flow diagram illustrating a method of transporting a carrier 1200 in a vacuum chamber 2100 according to embodiments described herein.

In box 310, a carrier 1200 is transported along a track assembly 1100 in a transport direction T while the weight of the carrier 1200 is at least partially counteracted by the first passive magnetic unit of the track assembly and the first passive magnetic unit of the carrier.

In box 320, a carrier 1200 is transported along a track assembly 1100 in a transport direction T while the weight of the carrier 1200 is at least partially counteracted by the second passive magnetic unit of the track assembly and the second passive magnetic unit of the carrier.

In box 330, the carrier 1200 is transferring on the track assembly 1100 with partial weight of the carrier 1200 on the at least one of the pluralities of the rollers 1131. The resultant force of the magnetic levitation forces (1110-1210 and 1120-1220) and the pulling downward force generated by drive assembly 1140 and the third passive magnetic unit 1230 can be 10% of the carrier weight or less.

The method 300 further comprising a drive assembly being configured to be able to provide a pulling/pushing force in the transportation direction T in order to transfer the carrier 1200.

Embodiments described herein can be used for transporting carriers carrying at least one of large-area substrates, glass substrates, wafers, semiconductor substrates, masks, shields, and other objects. The carriers can carry one single object, e.g., a large-area substrate with a size of 1 m$^2$ or more, particularly 5 m$^2$ or 10 m$^2$ or more, or a plurality of objects having a smaller size, e.g. a plurality of semiconductor wafers. The carrier may include a holding device configured to hold the object at the carrier, e.g. a magnetic chuck, an electrostatic chuck, or a mechanical chucking device.

The carrier may have an essentially vertical orientation during transport (e.g., vertical+/−10°). Specifically, the vacuum processing system may be configured for vertical substrate processing.

While the foregoing is directed to embodiments, other and further embodiments may be devised without departing from the basic scope, and the scope is determined by the claims that follow.

The invention claimed is:

1. A carrier transport system for transporting a carrier within a vacuum chamber, comprising:
    a track assembly extending in a transport direction, the track assembly comprising:
    a first passive magnetic unit provided at a first vertical coordinate and extending in the transport direction,
    a second passive magnetic unit provided at a second vertical coordinate and extending in the transport direction, wherein the first passive magnetic unit and the second passive magnetic unit are configured to counteract a weight of the carrier; the second passive magnetic unit is configured to be on a side of the carrier and configured to couple with a second carrier passive magnetic unit, wherein the first passive magnetic unit and the second passive magnetic unit include permanent magnets; and
    a roller transportation track provided at a third vertical coordinate and comprising a plurality of rollers configured to support partial weight of the carrier,
    wherein a first vertical distance between the first vertical coordinate and the second vertical coordinate is larger than a second distance between the second vertical coordinate and the third vertical coordinate.

2. The carrier transport system according to claim 1, further comprising:

a drive assembly having a set of active magnets extending in the transport direction generating a force parallel to the force of gravity.

3. The carrier transport system according to claim 2, wherein the drive assembly is further configured to provide a force in the transport direction.

4. The carrier transport system according to claim 3, wherein the second vertical coordinate of the second passive magnetic unit is vertically located between the first vertical coordinate of first passive magnetic unit and the set of magnets of the drive assembly.

5. The carrier transport system according to claim 2, wherein the second vertical coordinate of the second passive magnetic unit is vertically located between the first vertical coordinate of first passive magnetic unit and the set of magnets of the drive assembly.

6. The carrier transport system according to claim 1, wherein the transport direction is essentially horizontal having a deviation from exact horizontality by an angle of up to 15 degrees.

7. The carrier transport system according to claim 1, wherein the carrier is configured for being transported in a vertical or near-vertical orientation, that is, an orientation that deviates from exact verticality by an angle of up to 15 degrees.

8. The carrier transport system according to claim 1, wherein the first passive magnetic unit is configured to counteract at least 20% of the weight of the carrier, and the second passive magnetic unit is configured to counteract at least 60% of the weight of the carrier.

9. The carrier transport system according to claim 1, wherein magnetic poles of the first passive magnetic unit and the second passive magnetic unit are configured for lateral guiding of the carrier.

10. The carrier transport system according to claim 1, wherein the plurality of rollers extend at least partially parallel to a rotation axis of the respective rollers.

11. The carrier transport system according to claim 1, wherein a portion of the plurality of rollers have a cylindrical shape.

12. A carrier for a substrate to be processed in an apparatus for vacuum processing of the substrate, comprising:
    a first carrier passive magnetic unit provided at a first vertical carrier coordinate;
    a second carrier passive magnetic unit provided at a second vertical carrier coordinate;
    a third carrier passive magnetic unit provided at a third vertical carrier coordinate, wherein a first vertical carrier distance between the first vertical carrier coordinate and the second vertical carrier coordinate is larger than a second carrier distance between the second vertical carrier coordinate and the third vertical carrier coordinate;
    a first rail configured to be in contact with a top surface of at least one of a plurality of rollers of a roller transportation track; and
    a second rail configured to be in contact with a bottom of the at least one of the plurality of rollers.

13. The carrier according to claim 12, wherein the second carrier passive magnetic unit is laterally offset with respect to the first carrier passive magnetic unit, wherein the offset is in a direction perpendicular to a transport direction and in a direction perpendicular to the vertical direction.

14. An apparatus for vacuum processing of a substrate, comprising:
    a vacuum chamber; and
    a carrier transport system comprising:
        a track assembly extending in a transport direction, the track assembly comprising:
            a first passive magnetic unit provided at a first vertical coordinate and extending in the transport direction,
            a second passive magnetic unit provided at a second vertical coordinate and extending in the transport direction, wherein the first passive magnetic unit and the second passive magnetic unit are configured to counteract a weight of a carrier; the second passive magnetic unit is configured to be on a side of the carrier and configured to couple with a second carrier passive magnetic unit, wherein the first passive magnetic unit and the second magnetic passive magnetic unit include permanent magnets; and
        a roller transportation track provided at a third vertical coordinate and comprising a plurality of rollers configured to support partial weight of the carrier,
    wherein a first vertical distance between the first vertical coordinate and the second vertical coordinate is larger than a second distance between the second vertical coordinate and the third vertical coordinate.

15. The apparatus for vacuum processing of a substrate according to claim 14, further comprising:
    a deposition apparatus within the vacuum chamber.

16. The apparatus according to claim 14, further comprising:
    a carrier comprising:
        a first carrier passive magnetic unit provided at a first vertical carrier coordinate;
        a second carrier passive magnetic unit provided at a second vertical carrier coordinate;
        a third carrier passive magnetic unit provided at a third vertical carrier coordinate, wherein a first vertical carrier distance between the first vertical carrier coordinate and the second vertical carrier coordinate is larger than a second carrier distance between the second vertical carrier coordinate and the third vertical carrier coordinate;
        a first rail configured to be in contact with a top surface of at least one of a plurality of rollers of a roller transportation track; and
        a second rail configured to be in contact with a bottom of the at least one of the plurality of rollers.

17. The apparatus for vacuum processing of a substrate according to claim 16, wherein the first passive magnetic unit of the track assembly is configured to be on top of the carrier being coupled with the first passive magnetic unit of the carrier.

18. A method for transportation of a carrier within a vacuum chamber, comprising:
    transporting the carrier on a track assembly with partial counteraction of a weight of the carrier by first passive magnetic units;
    transporting the carrier on the track assembly with partial counteraction of the weight of the carrier by second passive magnet units, wherein a second passive magnetic unit of the track assembly is configured to be on a side of the carrier and configured to couple with a second carrier passive magnetic unit; and
    transporting the carrier on the track assembly with partial weight of the carrier on at least one of a plurality of rollers.

19. The method for transportation of a carrier according to the claim 18, further comprising:

transporting the carrier in a transport direction with a drive assembly.

\* \* \* \* \*